(12) United States Patent  
Rahmat et al.

(10) Patent No.: US 8,065,129 B1  
(45) Date of Patent: Nov. 22, 2011

(54) METHODS AND APPARATUSES FOR CIRCUIT SIMULATION

(75) Inventors: Khalid Rahmat, Fremont, CA (US); Ming Huei Young, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 814 days.

(21) Appl. No.: 10/993,760

(22) Filed: Nov. 19, 2004

(51) Int. Cl.  
*G06F 17/50* (2006.01)

(52) U.S. Cl. .......................................... 703/14; 716/110

(58) Field of Classification Search .................... 703/13, 703/14, 19  
See application file for complete search history.

(56) References Cited

U.S. PATENT DOCUMENTS

| | | | | |
|---|---|---|---|---|
| 5,826,215 | A * | 10/1998 | Garrett et al. | 702/75 |
| 6,063,130 | A * | 5/2000 | Sakamoto | 703/14 |
| 6,101,323 | A * | 8/2000 | Quarles et al. | 703/2 |
| 7,107,198 | B2 * | 9/2006 | Leonhardt | 703/13 |

OTHER PUBLICATIONS

Pillage et al., "Electronic Circuit and System Simulation Methods", McGraw Hill, 1995, pp. 1-6, 18-24, 31-36, 47-50, 75-86.*  
Gersem et al., "Solution Strategies for Transient, Field-Circuit Coupled Systems", IEEE Transcations on Magnetics, Jul. 2000, vol. 36, No. 4.*  
Chen et al. "Efficient Large-Scale Power Grid Analysis Based on Preconditioned Krylov-Subspace Iterative Methods" ACM, DAC Jun. 18-22, 2001, pp. 559-562.*  
Golub GH, Van Loan CF. "Matrix Computations" Baltimore, Maryland: Johns Hopkins University Press 1983. Specifically Chapter 10.2: The Conjugate Gradient Method, pp. 520-532 http://books.google.com/books?id=mlOa7wPX6OYC&dq=matrix+computations&printsec=frontcover&source=bl&ots=lbfng6H4fV&sig=rL2VymjnVMrO8un1yj7760_uXeQ&hl=en&ei=tn7LSsLCOISeswPym7ycAQ&sa=X&oi=book_result&ct=result&resnum=3#v=onepage&q=&f=false.  
Demmel, J.W. "Applied Numerical Linear Algebra," Society for Industrial and Applied Mathematics (SIAM), 1997. Specifically 6.6. 3-6.6.5 Conjugate Gradient Method, pp. 307-316. http://books.google.com/books?id=Ir8cFi-YWnlC&dq=applied+numerical+linear+algebra+demmel&printsec=frontcover&source=bl&ots=N5RMoQ7NNS&sig=yAFHEHxAPokMBtbbBiXxlmcEYrk&hl=en&ei=rn_LSvmbKJLUsgPRiZ2QAQ&sa=X&oi=book_result&ct=result&resnum=2#v=onepage&q=&f=false.  
Kaustav Banerjee, et al. "Analysis and Optimization of Thermal Issues in High-Performance VLSI". Apr. 2001. pp. 230-237. Sonoma, California.  
Kyoung Keun Lee, et al. "Thermal-driven Circuit Partitioning and Floorplanning with Power Optimization". School of Electrical and Computer Engineering.  
Guoqiang Chen, et al. "Partition-Driven Standard Cell Thermal Placement". Apr. 2003. pp. 75-80. Monterey, California.  
Farid N. Najm. "A Survey of Power Estimation Techniques in VLSI Circuits". IEEE Trans. on VLSI, Dec. 1994. pp. 1-21.

(Continued)

*Primary Examiner* — Kamini S Shah  
*Assistant Examiner* — Suzanne Lo  
(74) *Attorney, Agent, or Firm* — Blakely, Sokoloff, Taylor & Zafman LLP; Judith A. Szepesi

(57) ABSTRACT

Methods and apparatuses for transient simulation of circuits. One embodiment of the present invention eliminates the inductive branch current variables in terms of node voltage variables to generate a linear equation system with a sparse, symmetric and positive definite matrix, which can be solved efficiently using a pre-conditioned conjugate gradient method. The known vector of the linear equation system includes the contribution from the known inductive branch currents at a previous time instance. In one embodiment of the present invention, a node on a branch to a known voltage, such as ground, and on two resistive branches are identified and eliminated to form the linear equation system with a reduced dimension. In one embodiment of the present invention, multiple time step sizes are selectively used to balance the accuracy in transient simulation and efficiency.

27 Claims, 8 Drawing Sheets

OTHER PUBLICATIONS

Shamik Das, et al. "Timing, Energy, and Thermal Performance of Three-Dimensional Integrated Circuits". Apr. 2004. Boston, Massachusetts.

Osman S. Unsal, et al. "System-Level Power-Aware Design Techniques in Real-Time Systems". Proceedings of the IEEE, vol. 91, No. 7, Jul. 2003.

Kaushik Roy, et al. "Leakage Current Mechanisms and Leakage Reduction Techniques in Deep-Submicrometer CMOS Circuits". Proceedings of the IEEE, vol. 91, No. 2, Feb. 2003.

Pillage, L. T., et al., "Electronic Circuit of System Simulation Methods", pp. 200-204. Chaper 7.6 Sparse Tableau Analysis.

Tsai, Ching-Han, et al. "Standard Cell Placement for Even On-Chip Thermal Distribution", 6 pages. University of Illinois at Urbana-Champaign, Department of Electrical and Computer Engineering, Coordinated Science Laboratory.

Chen, Tsung-Hao, et al., "Efficient Large-Scale Power Grid Analysis Based on Preconditioned Krylov-Subspace Iterative Methods" Copyright 2001 ACM 0-89791-88-6/97/05 DAC 2001, Jun. 18-22, 2001, Las Vegas, Nevada USA 4 pages.

Clark, J.V., et al., "3D MEMS Simulation Modeling Using Modified Nodal Analysis", 8 pages. Berkeley Sensor and Actuator Center, 497 Cory Hall, University of California at Berkeley, Berkeley CA, USA cfm@bsac.eecs.berkeley.edu.

Clark, J.V., et al., "Modified Nodal Analysis for MEMS with Multi-Energy Domains", 4 pages. Berkeley Sensor and Actuator Center, 497 Cory Hall, University of California at Berkeley, Berkeley CA, USA jvclark@bsac.eecs.berkeley.edu nzhou@bsac.eecs.berkeley.edu.

Nassif, Sani R., et al., "Fast Power Grid Simulation" Copyright 2000 ACM 1-58113-188-7/00/0006, pp. 156-161. DAC 2000, Los Angeles CA.

Zachmann, Dave "Conjugate Gradient Method", 4 pages, Feb. 5, 1999 downloaded from http://cauchy.math.colostate.edu/Resources/SD_CG/conjgrad/node1.html.

* cited by examiner

METHODS AND APPARATUSES FOR CIRCUIT SIMULATION

FIELD OF THE TECHNOLOGY

The invention relates to circuit simulation, and more particularly to the transient simulations of linear circuits.

BACKGROUND

A general resistive, capacitive and inductive network can be analyzed by using the circuit laws known as Kirchoff's current law (KCL) and Kirchoff's voltage law (KVL) to generate sets of coupled differential equations. A common method to generate these equations is called Modified Nodal Analysis (MNA). Other methods such as the Sparse Tableau Method may also be used to create equivalent systems of equations (see, e.g., T. L. Pillage, R. A. Rohrer and C. Visweswariah, "Electronic Circuit and System Simulation Methods", McGraw Hill, 1995).

Many methods, such as backward Euler, trapezoidal rule, etc. can be used to discretize the differential equations for transient simulation. The discretized differential equations represent the relation between the voltages and/or currents in the circuit at two or more time instances. Thus, from the known voltages and/or currents at one or more times instances, the voltages and/or currents at another time instance can be obtained. The differential equations are typically discretized in time to produce a matrix equation for a time step. Typically, the matrix equation for a linear circuit with inductors represents a linear equation system whose unknown is the vector of voltages and currents in the circuit at a time step. The known vector of the matrix equation (e.g., the right hand side of the equations of the linear equation system) typically depends on previous known time step results and/or known input stimuli.

SUMMARY OF THE DESCRIPTION

Methods and apparatuses for transient simulation of circuits are described herein. Some of the embodiments of the present invention are summarized in this section.

One embodiment of the present invention eliminates the inductive branch current variables in terms of node voltage variables to generate a linear equation system with a sparse, symmetric and positive definite matrix, which can be solved efficiently using a pre-conditioned conjugate gradient method. The known vector of the linear equation system includes the contribution from the known inductive branch currents at a previous time instance. In one embodiment of the present invention, a node on a branch to a known voltage, such as ground, and on two resistive branches are identified and eliminated to form the linear equation system with a reduced dimension. In one embodiment of the present invention, multiple time step sizes are selectively used to balance the accuracy in transient simulation and efficiency.

In one aspect of the present invention, a method of transient simulation of a linear circuit, includes: determining a third node of a linear circuit, the third node shared by a first resistive branch, a second resistive branch and a third branch, the first resistive branch connecting the third node to a first node, the second resistive branch connecting the third node to a second node, the third branch connecting the third node to a known voltage; determining a first linear equation system for transient simulation of the linear circuit, the first linear equation system including unknown variables representing the first and second nodes but no unknown variable representing the third node; and determining the unknown variables representing the first and second nodes from the first linear equation system.

In one example of an embodiment, the method further includes: determining a voltage for the third node from the voltages for the first and second nodes; where the unknown variables represent voltages on the first and second nodes.

In one example, the third branch is capacitive; and the known voltage is ground. In another example, the third branch is inductive.

In one example of an embodiment, the first linear transient simulation equation system is symmetric and positive definite; the first linear transient simulation equation system is solved using a conjugate gradient method; and the circuit includes at least one inductive branch.

In one example of an embodiment, the first and second nodes are on the first and second branches respectively.

In one example of an embodiment, the method further includes: determining a second linear equation system for transient simulation of the linear circuit, the second linear equation system including unknown variables for the first, second and third nodes; and eliminating an unknown variable of the third node in terms of the unknown variables of the first and second nodes to generate the first linear equation system.

In one example of an embodiment, a path between the first and second nodes includes a fourth node; the first linear transient simulation equation system includes no unknown variable for the fourth node; and the fourth node is shared by two resistive branches on the path and a branch which connects to a known voltage.

In one aspect of the present invention, a method of transient simulation of a linear circuit, includes: determining a linear equation system for transient simulation of the linear circuit, the linear circuit including at least one inductive branch, the linear transient simulation equation system being symmetric and positive definite; and determining a known vector of the equation system from at least a representation of at least one inductive branch current at a previous time instance to solve for an unknown vector from the linear equation system.

In one example of an embodiment, the linear equation system includes no unknown variable representing an inductive branch current; and the method further includes: determining one or more inductive branch currents from an integration of a representation of voltages calculated from the linear equation system; where the unknown vector representing node voltages at a plurality of nodes of the circuit.

In one example of an embodiment, the method further includes: solving the linear equation system using a conjugate gradient method for the unknown vector from the known vector.

In one example of an embodiment, the representation of at least one inductive branch current includes an integration of a representation of voltage solutions at a number of time instances.

In one aspect of the present invention, a method of transient simulation of a linear circuit, includes: determining a plurality of matrices of linear equation systems for transient simulation of the linear circuit at a plurality of time step sizes respectively; selecting a first time step size from the plurality of time step sizes for a first simulation step in time; determining a representation of voltages for the linear circuit for the first simulation step using a first one of the plurality of matrices corresponding to the first time step size; selecting a second time step size from the plurality of time step sizes for a second simulation step in time; and determining a representation of voltages for the linear circuit for the second simulation step using a second one of the plurality of matrices corresponding to the second time step size; where the first time step size is different from the second time step size.

In one example of an embodiment, the plurality of matrices are symmetric and positive definite; the first and second time step sizes are selected according to changes in a representation of changes in load currents.

In one example of an embodiment, the first time step size is larger than the second time step size when no load current change is larger than a threshold; the first time step size is smaller than the second time step size when a load input current change is larger than a threshold.

In one example of an embodiment, the representation of changes in load currents includes changes to known vectors' of the linear equation systems over time.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
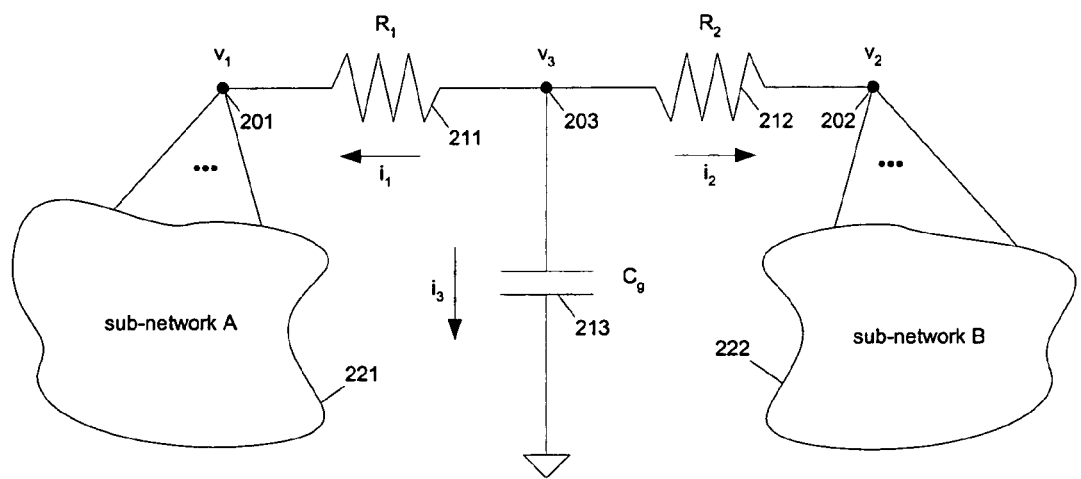
FIG. 1 illustrates a method to reduce a node according to one embodiment of the present invention.

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to one or an embodiment in the present disclosure are not necessarily references to the same embodiment; and, such references mean at least one.

At least one embodiment of the present invention includes methods for efficient simulation of a circuit, such as large linear circuit networks which typically include resistive, capacitive and inductive elements. Fast solution methods according to embodiments of the present invention can be used in many different analysis and optimization problems, such as power mesh analysis of a design of an Integrated Circuit (IC) chip. The methods can also be used for the transient analysis of a general network including resistors, inductors, and capacitors.

One example of a general linear network including, resistors, inductors and capacitors is a power supply grid of an integrated circuit. Interconnect and power supply networks both on and off-chip are represented as networks of resistors (R), inductors (L), and capacitors (C), or RLC networks. Certain types of RLC networks can be particularly large. For example, the power mesh of a chip can contain millions of R, L, and C elements and nodes, which represent individual connections to each gate. Similarly the network used to represent the substrate of a semiconductor chip may contain millions of elements as the network represents the whole chip and provide details down to individual components or gates.

To simulate the behavior of such a network, time varying voltage sources and/or current sources can be applied to certain nodes to observe the behavior of all the remaining nodes and branches over the time period of interest, such as a clock cycle. Transient simulation is usually performed through discretizing the time period over which the simulation is performed into a number of time steps. The solution at the previous time instance is used to calculate the solution at the current time instance. Thus, the transient simulation is advanced one time step a time over the time period of interest based on the solution at the previous time instance.

For a time step, modified nodal analysis (MNA) typically provides a matrix equation system of the form $Mx=y$, where M is a sparse matrix, x is the vector of unknown node voltages and inductor currents and y is a known vector which may depend on the solution of the previous time instance. When M is symmetric and positive definite, the equation system $Mx=y$ is symmetric and positive definite; otherwise, the equation system $Mx=y$ is not symmetric and positive definite. All the eigenvalues of a symmetric and positive definite matrix are real and positive. In the presence of inductors, M is not symmetric and positive definite; and the equation system for the transient simulation is not symmetric and positive definite.

When only resistors and capacitors are present in the circuit, the matrices produced by Modified Nodal Analysis (MNA) is symmetric and positive definite. When inductors are present in the circuit, the matrix produced by MNA (or other techniques) is typically not symmetric and positive definite. If self-inductances are included in the network, the unknown x of the equation system of MNA includes not only node (or capacitor) voltages but also inductor currents; and the matrix M generated by MNA is not symmetric and positive definite. Thus, when inductors are present in the circuit, the matrix equation of a traditional method is solved by general sparse matrix techniques. Typically, Gaussian elimination is used, which limits the size of the problem that can be solved for a given computer memory size and limits the efficiency of transient simulation of circuits with inductors.

In one embodiment of the present invention, a sparse matrix M that is symmetric and positive definite is generated for the transient simulation, even when inductive elements are present. Thus, efficient methods for solving a symmetric and positive definite sparse equation system can then be used to solve the matrix equation for the transient simulation of the circuit with inductive elements. For example, pre-conditioned conjugate gradient methods can be used when the matrix equation is symmetric and positive definite. Since all the eigenvalues of a symmetric and positive definite matrix are real and positive, a class of fast iterative solution techniques, such as conjugate gradient methods, can be applied to solve the matrix equation if the matrix is symmetric and positive definite. The property of sparse, symmetric and positive definite of the matrix allows the use of efficient matrix reduction techniques, such as pre-conditioned conjugate gradient methods, for fast transient simulations of large linear circuit networks of resistive, capacitive and inductive elements.

Many references describe methods to solve large linear circuit problems by MNA techniques or other methods. Typically, these traditional methods utilize both the node voltages and inductor currents as state variables which lead to a matrix which is not symmetric and positive definite and therefore cannot be solved by conjugate gradient methods. See, for example, T. L. Pillage, R. A. Rohrer and C. Visweswariah, "Electronic Circuit and System Simulation Methods", McGraw Hill, 1995.

In one embodiment of the present invention, a sparse, symmetric and positive definite matrix equation system is generated for circuits with inductors. Thus, any techniques for solving a sparse, symmetric and positive definite matrix equation system, such as pre-conditioned conjugate gradient methods, can be used in the transient simulation of circuits with inductors.

If the matrix M is symmetric and positive definite, special techniques to solve the M x=y equation exist. These techniques such as the conjugate gradient method can be very fast and do not require as much memory as methods such as Gaussian elimination that work on general matrices. More details of the conjugate gradient methods may be found in G. H. Golub, C. F. Van Loan, "Matrix Computations", Johns Hopkins University Press, 1983; J. W. Demmel, "Applied Numerical Linear Algebra", Society for Industrial and Applied Mathematics (SIAM), 1997, etc.

In general a conjugate gradient method offers the advantage of being faster than direct methods such as Gaussian elimination in solving sparse matrices. Further, a conjugate gradient method requires significantly less memory than Gaussian elimination. During the process of Gaussian elimination a large number of 0 entries in the original sparse matrix become non-zero which requires additional storage. This can lead to significantly larger memory requirements than an iterative method, such as a conjugate gradient method, which does not require the creation of matrices any larger than the original sparse matrix.

One embodiment of the present invention formulates the problem in such a way that even with inductances present, the matrix that is created is symmetric and positive definite. This allows the conjugate gradient method to be applied to the problem with inductors thus reducing the runtime and memory requirements.

In one embodiment of the present invention, the equations for the RLC network is written as two coupled vector differential equations for the node voltages and the inductor currents. The equation for the node voltages vector is discretized in time (e.g., using the Trapezoidal rule) to generate a sparse matrix equation for each time step. The equation for the inductor currents is integrated in time to write the inductor current at the current time instance as a function of the inductor current at the previous time instance and node voltages. The inductor current equation is then substituted in the equation for the node voltages, thus eliminating the inductor current as a variable. This leads to the creation of a symmetric and positive definite matrix that can be solved using the fast methods such as conjugate gradients.

In general, an RLC network can be represented as a directed graph. A branch of the directed graph has an element connecting two nodes. A branch can have a resistor, a capacitor, an inductor, or a current source. Thus, the branches of the graph can be partitioned into resistive branches, capacitive branches, inductive branches and current source branches. An adjacent matrix A can be defined for the directed graph such that an element $A_{ij}$, is: 1 if node j is the source of branch i; 0 if node j is the sink of branch i; and 0 if otherwise. The vector of node voltages can be represented as $V_n$; the vector of branch voltages can be represented as $V_b$; and the vector of branch currents can be represented as $I_b$.

Kirchoff's current law (KCL) can be written as:

$$A^T I_n = 0$$

Kirchoff's voltage law (KVL) can be written as:

$$AV_n = V_b$$

To partition the branches according to the types, the branch currents can be represented as:

$$I_b^T = \{I_i^T, I_g^T, I_c^T, I_l^T\}$$

where $I_i$, $I_g$, $I_c$ and $I_l$ are the vectors of branch currents for current source branches, resistive branches, capacitive branches, and inductive branches respectively.

Similarly, the branch voltage can be represented as:

$$V_b^T = \{V_i^T, V_g^T, V_c^T, V_l^T\}$$

where $V_i$, $V_g$, $V_c$ and $V_l$ are the vectors of branch voltages for current source branches, resistive branches, capacitive branches, and inductive branches respectively.

Similarly, the adjacent matrix A can be partitioned as:

$$A^T = \{A_i^T, A_g^T, A_c^T, A_l^T\}$$

where $A_i$, $A_g$, $A_c$ and $A_l$ are for the current source branches, resistive branches, capacitive branches, and inductive branches respectively.

Thus, when the branches are partitioned into current source branches, resistive branches, capacitive branches, and inductive branches, Kirchoff's voltage law (KVL) can be written as:

$$V_i = A_i V_n, \; V_g = A_g V_n, \; V_c = A_c V_n, \text{ and } V_l = A_l V_n$$

Kirchoff's current law (KCL) can be represented as:

$$A_i^T I_i + A_g^T I_g + A_c^T I_c + A_l^T I_l = 0$$

The relationship between the branch currents and branch voltages for the resistive branches is:

$$I_g = GV_g = GA_g V_n$$

where G is a diagonal matrix. The relationship between the branch currents and branch voltages for the capacitive branches is:

$$I_c = C\frac{dV_c}{dt} = CA_c \frac{dV_n}{dt}$$

where C is a diagonal matrix. The relationship between the branch currents and branch voltages for the inductive branches is:

$$V_l = L\frac{dI_l}{dt} = A_l V_n$$

where L is a symmetric and positive definite matrix. In the absence of mutual inductances, L is a diagonal matrix.

Eliminating the branch currents $I_g$ and $I_c$ for the resistive branches and the capacitive branches in terms of the node voltages leads to the following form of Kirchoff's current law (KCL).

$$A_i^T I_i + A_g^T G A_g V_n + A_c^T C A_c \frac{dV_n}{dt} + A_l^T I_l = 0$$

which can be combined with the relationship between the branch currents and node voltages for the inductive branches to form an equation system in the form of:

$$G_x X_x + C_x \frac{dX_x}{dt} = B_x$$

where $X_x^T = \{V_n, I_l\}$; $G_x = \{\{A_g^T G A_g V_n, A_l^T\}, \{A_l^T, 0\}\}$; $C_x = \{\{A_c^T C A_c, 0\}, \{0, -L\}\}$; and $B_x^T = \{-A_i^T I_i, 0\}$. A typically traditional method based on Modified Nodal Analysis uses both $V_n$ and $I_l$ as the unknown variable vector $X_x$ in solving the differential equations for transient simulation. In the presence of inductive branches, the traditional approach of using the both $V_n$ and $I_l$ as the unknown variable leads to an equation system with a matrix that is not symmetric and positive definite.

In one embodiment of the present invention, the unknown inductive branch currents $I_l$ are represented as in terms of node voltages $V_n$ and known quantities. Thus, the unknown inductive branch currents $I_l$ in the Kirchoff's current law (KCL) can then be replaced in terms of an expression of node voltages $V_n$.

For example, in one embodiment, the relationship between the branch currents and node voltages for the inductive branches is integrated using a Trapezoidal rule for a time step of transient simulation.

$$(I_l^{t+\Delta} - I_l^t) = \Delta L^{-1} A_l (V_n^{t+\Delta} + V_n^t)/2$$

Thus, $I_l^{t+\Delta}$ can be represented as:

$$I_l^{t+\Delta} = \Delta L^{-1} A_l (V_n^{t+\Delta} + V_n^t)/2 + I_l^t$$

where $V_n^t$ and $I_l^t$ are known quantities at the time instance t for the determination the unknowns $V_n^{t+\Delta}$ and $I_l^{t+\Delta}$ at the time instance $t+\Delta$, where $\Delta$ is the time step size. This relationship can be used in the Kirchoff's current law (KCL) to eliminate the unknown $I_l^{t+\Delta}$.

For example, Kirchoff's current law (KCL) can be discretized using a Trapezoidal rule as:

$$A_i^T(I_l^{t+\Delta} + I_l^t)/2 + A_g^T G A_g (V_n^{t+\Delta} + V_n^t)/2 + A_l^T(I_l^{t+\Delta} + I_l^t)/2 + A_c^T C A_c (V_n^{t+\Delta} - V_n^t)/\Delta = 0$$

When $I_l^{t+\Delta}$ is replaced with the expression in terms of $V_n^{t+\Delta}$ in the discretized Kirchoff's current law (KCL), $$A_i^T(I_l^{t+\Delta} + I_l^t)/2 + A_g^T G A_g (V_n^{t+\Delta} + V_n^t)/2 + A_l^T(\Delta L^{-1} A_l (V_n^{t+\Delta} + V_n^t)/2 + 2I_l^t)/2 + A_c^T C A_c (V_n^{t+\Delta} - V_n^t)/\Delta = 0$$

which can be rearranged as:

$$(A_g^T G A_g + \Delta A_l^T L^{-1} A_l/2 + 2A_c^T C A_c/\Delta) V_n^{t+\Delta} = -A_i^T(I_l^{t+\Delta} + I_l^t) + (2A_c^T C A_c/\Delta - A_g^T G A_g - \Delta A_l^T L^{-1} A_l/2) V_n^t - 2A_l^T I_l^t$$

or $$A_n V_n^{t+\Delta} = B_n$$

where $A_n = A_g^T G A_g + \Delta A_l^T L^{-1} A_l/2 + 2A_c^T C A_c/\Delta$; and $B_n = -A_i^T(I_l^{t+\Delta} + I_l^t) + (2A_c^T C A_c/\Delta - A_g^T G A_g - \Delta A_l^T L^{-1} A_l/2) V_n^t - 2A_l^T I_l^t$.

Since the matrix $A_n$ is symmetric and positive definite, $V_n^{t+\Delta}$ can be solved for using a pre-conditioned conjugate gradient method.

Note that $I_l^{t+\Delta}$ can also be integrated from time $t_0$ based on the node voltage solutions of previous time instances t, $t_{n-1}$, $t_{n-2}$, ..., $t_0$. For example, using a trapezoidal rule, $$(I_l^{t+\Delta} - I_l^0) = L^{-1} A_l [\Delta(V_n^{t+\Delta} + V_n^t)/2 + (t-t_{n-1})(V_n^t + V_n^{n-1})/2 + (t_{n-1} - t_{n-2})(V_n^{n-1} + V_n^{n-2})/2 + \ldots + (t_1 - t_0)(V_n^1 + V_n^0)/2]$$

where $V_n^{n-1}$, $V_n^{n-2}$, ..., and $V_n^0$ are the previous node voltage solutions for time instances $t_{n-1}$, $t_{n-2}$, ..., $t_0$ respectively.

Using the above expression of $I_l^{t+\Delta}$ integrated from time $t_0$ in the discretized Kirchoff's current law (KCL) leads to the same symmetric and positive definite matrix $A_n = A_g^T G A_g + \Delta A_l^T L^{-1} A_l/2 + 2A_c^T C A_c/\Delta$ but a different expression for the right hand vector of the equation system. In general, when different time discretization rules (e.g., forward Euler, backward Euler, Trapezoidal, etc.) are used, the matrix $A_n$ and the known vector $B_n$ may take different forms. However, $A_n$ is symmetric positive definite; and $B_n$ includes contribution from known inductive currents at previous time instances, such as $-2A_l^T I_l^t$.

Note that $I_l^t$ can also be integrated from time $t_0$ based on the node voltage solutions of previous time instances $t_{n-1}$, $t_{n-2}$, ..., $t_0$. Thus, $$(I_l^t - I_l^0) = L^{-1} A_l [(t-t_{n-1})(V_n^t + V_n^{n-1})/2 + (t_{n-1} - t_{n-2})(V_n^{n-1} + V_n^{n-2})/2 + \ldots + (t_1 - t_0)(V_n^1 + V_n^0)/2]$$

It is seen that the difference between $(I_l^{t+\Delta} - I_l^0)$ and $(I_l^t - I_l^0)$ provides $$(I_l^{t+\Delta} - I_l^t) = \Delta L^{-1} A_l (V_n^{t+\Delta} + V_n^t)/2$$

Therefore, integrating from time $t_0$ based on the node voltage solutions of previous time instances t, $t_{n-1}$, $t_{n-2}$, ..., $t_0$ is equivalent to using the previous inductive branch currents at the previous time instance t.

In general, the matrix of the equation system, such as $A_n = A_g^T G A_g + \Delta A_l^T L^{-1} A_l/2 + 2A_c^T C A_c/\Delta$, is a function of the time step size $\Delta$. When different time step sizes are used, different matrices are evaluated and pre-conditioned. In one embodiment of the present invention, multiple matrices for the solving the node voltages using different time step sizes are computed and stored. When one of the time step sizes is selected as the current time step size, the corresponding matrix is used for solving the node voltage vector.

In one embodiment of the present invention, different time step sizes are used for the transient simulation. In one embodiment, the time step size for the computation of the voltages and currents is selected dynamically. In one embodiment, the time step size is selected to reduce the number of time steps that need to be analyzed without sacrificing accuracy, which translates into fewer solutions of the matrix problem and leads to faster overall runtime.

A common technique to speed up the conjugate gradient method is to use a pre-conditioner to convert the original matrix problem M x=y to a modified one Q M x=Q y. If the pre-conditioner matrix Q has certain properties, it is possible to solve the new system more efficiently then the original system M x=y, including the time required to generate the matrix Q. Further details about the pre-conditioner may be found in J. W. Demmel, "Applied Numerical Linear Algebra", Society for Industrial and Applied Mathematics (SIAM), 1997.

The matrix M for a transient simulation typically depends on the time step size. If a constant time step size is used for the whole simulation time period, only one M is needed; and therefore only one pre-conditioner Q needs to be generated. The time step size is typically chosen for the accuracy of the simulation—the smaller the time step size the greater the accuracy, but the longer the run time as many time steps are required to simulate a given time period (e.g., a complete clock cycle).

One embodiment of the present invention uses variable time step sizes to retain the high accuracy and reduce the number of time steps. Instead of using a single time step size, a number of different discrete time step sizes are selectively used. For example, a current time step size is selected from a set of time step sizes, such as $\Delta_1$, $\Delta_2$, $\Delta_3$ ... (e.g., $\Delta_1 < \Delta_2 < \Delta_3$ ...) can be used. In one example, for simplicity, the time step sizes have the relation $\Delta_2 = 2 \times \Delta_1$ and $\Delta_3 = 2 \times \Delta_2$, .... However, other ratios can also be used as well.

In one embodiment of the present invention, when the load current or the right hand side of the equation is not changing rapidly, a large time step size is selected to reduce the number of time steps need to cover a time period; when the load current or the right hand side of the equation is changing rapidly, a small time step size is selected to capture the change and provide sufficient accuracy.

In one embodiment, when the condition $(I^{k+1} - I^k) \times \Delta / C_{max} < \theta$ is satisfied for time step k+1, a large time step size is selected; otherwise, a small time step size is selected. The parameter $\theta$ is typically an empirical parameter; and $C_{max}$ is the maximum capacitance at any node.

In one embodiment of the present invention, the time step size is determined adaptively. For example, when the change in the known input stimuli is much smaller than that of the previous time step, a time step size larger than the previous time step size is selected for trial. The result from using the larger time step can be interpolated for comparison with the result from using the previous time step size. If the error is within a tolerant level, the larger time step is used subsequently. Similarly, when the change in the known input stimuli is much larger than that of the previous time step, a smaller time step size is selected for trial. If the interpolation from the result of using previous time step size shows that the previous time step size has an error above a tolerant level, the smaller time step size is used subsequently.

In one embodiment of the present invention, the parameter (e.g., $\theta$) to select a time step size is evaluated during the adaptive process of selecting time steps. The average values can be recorded as the empirical threshold for selecting time steps.

Thus, one embodiment of the present invention limits the error in the solutions, while using significantly fewer number of simulation steps than if only the minimum time step size $\Delta$ was used for all the simulation steps for the entire time period.

In one embodiment of the present invention, node reduction is performed to improve the efficiency of the simulation. In one embodiment, for example, a node connecting two resistive branches and a capacitive (or inductive or resistive) branch that is connected to a know voltage (e.g., ground, power, etc.) is eliminated through an expression in terms of the other nodes of the resistive branches.

One embodiment of the present invention reduces the size of the network in the presence of inductors and capacitors without impacting the accuracy of the solution. For the case of networks with only resistors, resistors can be combined to reduce the number of nodes. For example, if resistors are connected in series, the string of resistors can be combined with their values added as an equivalent resistor to eliminate the node in between.

However, when two resistors are connected in series with a capacitor on the common node between them, the two resistors cannot be merged as an equivalent resistor.

One embodiment of the present invention eliminates a common node that connects to two resistors and a third element (e.g., resistor, inductor, capacitor) that connects to a reference voltage, such as ground, power, etc. When the third element is a capacitor or inductor, the node is eliminated through considering the discretization in time. The voltage of the common node can be expressed as the voltage of its immediate neighboring nodes. Thus, voltage variable for the common node is eliminated in such a way that the solution obtained is exactly the same as without elimination. Eliminating the nodes reduces the size of the matrix of the equation system, which translates into faster solution and less memory requirements. In some types of circuit analysis, such as the power grid analysis, such nodes that can be eliminated using methods according embodiments of the present invention arise frequently. For example, many segments of power grid wires can be modeled with nodes that connect to a reference voltage, such as ground (or power), through capacitors and to other nodes through resistors to represent the segments of wires of the power grid. Therefore, reduction of these nodes can significantly reduce the memory usage and runtime.

FIG. 1 illustrates a method to reduce a node according to one embodiment of the present invention. In FIG. 1, a node 203 is on three branches: a first resistive branch with a resistor 211 ($R_1$), a second resistive branch with a resistor 212 ($R_2$), and a capacitive branch with a capacitor 213 ($C_g$). In the example of FIG. 1, the capacitive branch is further connected to ground; the first and second resistive branches are further connected to nodes 201 and 202 respectively; and nodes 201 and 202 are further connected to sub-networks 221 and 222 respectively. Sub-networks 221 and 222 may or may not further connect to each other.

The node voltages at nodes 201, 202 and 203 can be denoted as $v_1$, $v_2$ and $v_3$ respectively. The branch currents in branches of the resistor 211, the resistor 212 and the capacitor 213 can be denoted as $i_1$, $i_2$ and $i_3$ respectively. Thus, the relation between the node voltage and the branch currents can be written as:

$$v_3 - v_1 = R_1 i_1$$

$$v_3 - V_2 = R_2 i_2$$

$$C_g \frac{dv_3}{dt} = i_3$$

Kirchoff's current law (KCL) at node 203 can be written as:

$$i_1 + i_2 + i_3 = 0$$

In one embodiment of the present invention, the unknown variables $v_3^{t+\Delta}$ and $i_3^{t+\Delta}$ for the transient simulation of the circuit based on the known quantities at the time instance t are expressed in terms of node voltages for the adjacent nodes 201 and 202 so that the node 203 can be eliminated. Thus, a resulting equation system has a reduced dimension, which takes less time to solve and less memory to store the matrix.

For example, the relation for the capacitive branch can be discretized using a Trapezoidal rule as:

$$C_g(v_3^{t+\Delta} - v_3^t)/\Delta = (i_3^{t+\Delta} + i_3^t)/2$$

Thus, $$v_3^{t+\Delta} - (v_3^t + \Delta i_3^t/2C_g) = \Delta i_3^{t+\Delta}/2C_g$$

which can be rewritten as $$v_3^{t+\Delta} - v_x = R_x i_3^{t+\Delta}$$

where $R_x = \Delta/2C_g$; and $v_x = (v_3^t + R_x i_3^t)$.

Since Kirchoff's current law (KCL) at node 203 is:

$$i_1^{t+\Delta} + i_2^{t+\Delta} + i_3^{t+\Delta} = 0$$

$v_3^{t+\Delta}$ can be solved for as:

$$v_3^{t+\Delta} = (v_1^{t+\Delta}/R_1 + v_2^{t+\Delta}/R_2 + v_x/R_x)/(1/R_1 + 1/R_2 + 1/R_x)$$

which can be rewritten as $$v_3^{t+\Delta} = a_{31} v_1^{t+\Delta} + a_{32} v_2^{t+\Delta} + v_x^*$$

where $a_{31}=R^*/R_1$; $a_{32}=R^*/R_2$; $v_x^*=R^*(v_3^t/R_x+i_3^t)$; and $R^*=1/(1/R_1+1/R_2+1/R_x)$. Since $R_x=\Delta/2C_g$ which is not a function of node voltages, $a_{31}$ and $a_{32}$ are constants for a given time step size $\Delta$.

If the equation system before the reduction is $A_n V_n^{t+\Delta}=B_n$, where $$\{V_n^{t+\Delta}\}^T=\{\{V_r^{t+\Delta}\}^T, v_3\};$$

$$A_n = \begin{bmatrix} A_{rr} & A_{r3} \\ A_{r3}^T & A_{33} \end{bmatrix}; \text{ and}$$

$$B_n^T = \{\{B_r\}^T, B_3\}.$$

Since $v_3^{t+\Delta}=a_{31}v_1^{t+\Delta}+a_{32}v_2^{t+\Delta}+v_x^*$, $V_n^{t+\Delta}$ can be rewritten as:

$$V_n^{t+\Delta}=Q\{\{V_r^{t+\Delta}\}^T, v_x^*\}^T, \text{ where}$$

$$Q = \begin{bmatrix} Q_{rr} & 0 \\ 0 & 1 \end{bmatrix}.$$

Thus, the equation system can be reduced to $$Q_{rr}^T A_{rr} Q_{rr} V_r^{t+\Delta} = Q_{rr}^T B_r - v_x^* Q_{rr}^T A_{r3}$$

which has a dimension smaller than that of the original system $A_n V_n^{t+\Delta}=B_n$.

Although the capacitor 213 is connected to ground in the above example, the above approach can also be used when the capacitor 213 is connected to other known voltages, such as power.

Further, the relation $v_3^{t+\Delta}-v_x=R_x i_3^{t+\Delta}$ is equivalent to a circuit in which the capacitive branch with the capacitor 213 is replaced with an equivalent resistor $R_x$ that is connected to a known voltage $v_x$. Thus, it is understood that the above approach can also be used to eliminate the common node where the common node is connected to two resistive branches and another resistive branch that is further connected to a know voltage.

Similarly, if the capacitor 213 is replaced with an inductor, the node 203 can be similarly eliminated. For example, if the inductive branch is connected to ground, $$L_g \frac{di_3}{dt} = v_3$$

An integration scheme can be used to express $v_3^{t+\Delta}$ in terms of $i_3^{t+\Delta}$. For example, when a Trapezoidal rule is used, $$v_3^{t+\Delta}+(v_3^t+2L_g i_3^t/\Delta)=2L_g i_3^{t+\Delta}/\Delta$$

which can be rewritten as $$v_3^{t+\Delta}-v_x'=R_x' i_3^{t+\Delta}$$

where $R_x'=2L_g/\Delta$; and $v_x'=-(v_3^t+R_x i_3^t)$.

Thus, in general, when a node connects to two resistive branches and a third branch that is further connected to a known voltage, such as ground, power, etc., the node can be eliminated for the transient simulation according to one embodiment of the present invention.

Figure 2:
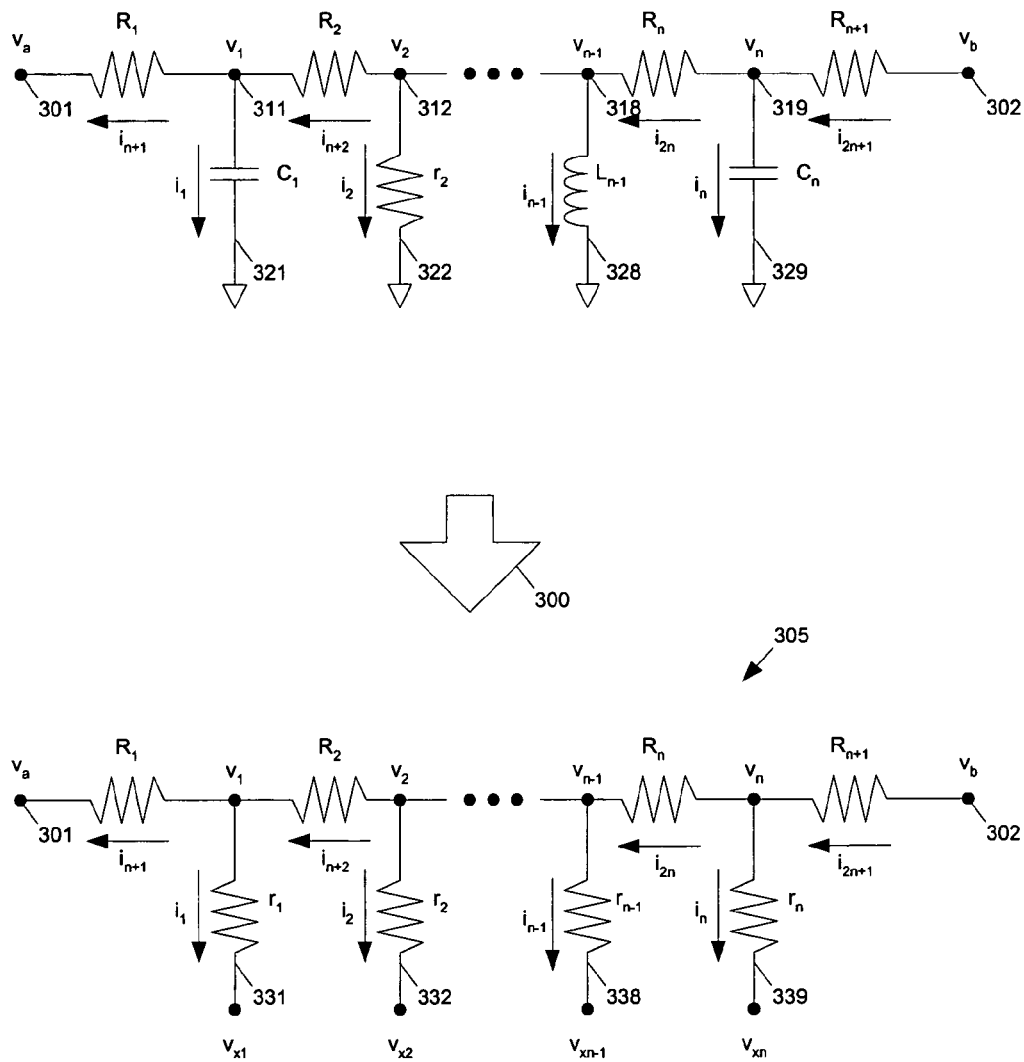
FIG. 2 illustrates a method to reduce a string of nodes according to one embodiment of the present invention.

FIG. 2 illustrates a method to reduce a string of nodes according to one embodiment of the present invention. In FIG. 2, a string of internal nodes 311, 312, ..., 318 and 319 are connected from one to another through a series of resistors $R_2, ..., R_n$ and further connected to the interface nodes 301 and 302 through resistors $R_1$ and $R_{n+1}$ respectively. Thus, resistors $R_1, R_2, ..., R_n$ and $R_{n+1}$ form a serial connection. Each of the internal nodes 311, 312, ..., 318 and 319 may be further connected to a know voltage, such as ground, power, etc. In FIG. 2, the branches 321, 322, ..., 328 are connected to ground. However, in general, it is understood that branches 321, 322, ..., 328 may be connected to different known voltages. Further, in general, some of the internal nodes 311, 312, ..., 318 and 319 may have more than one branch connecting to one or more known voltages; and some of the internal nodes 311, 312, ..., 318 and 319 may not have a branch connecting to a known voltages. However, none of the internal nodes has a branch connecting to a node with unknown voltage other than the internal nodes and the interface nodes 301 and 302. Further, the internal nodes may be connected to each other through other resistive branches but neither capacitive branch nor capacitive branch.

The discussion presented above shows that, in a transient simulation, a capacitive branch, or an inductive branch, that is connected to a known voltage can be equivalently represented as a resistive branch. Thus, branches 321, 322, ..., 328 and 329 can be equivalently represented as resistive branches 331, 332, ..., 338 and 339 through the calculation 300.

For example, for the computation of $v_1^{t+\Delta}$ and $i_1^{t+\Delta}$ for the capacitive branch 321 with a capacitor $C_1$, an equivalent resistor $r_1$ connected to known voltage $v_{x1}$ can be used, where $r_1=\Delta/2C_1$, which is half of the time step size divided by the value of the capacitor; and $v_{x1}=(v_1^t+r_1 i_1^t)$, which is a function of the known values at the previous time instance.

Similarly, for example, for the computation of the $v_{n-1}^{t+\Delta}$ and $i_{n-1}^{t+\Delta}$ for the inductive branch 328 with a capacitor $L_{n-1}$, an equivalent resistor $r_{n-1}$ connected to known voltage $v_{xn-1}$ can be used, where $r_{n-1}=2L_{n-1}/\Delta$, which is the value of the capacitor divided by half of the time step size; and $v_{xn-1}=-(v_{n-1}^t+r_{n-1}i_{n-1}^t)$, which is a function of the known values at the previous time instance.

Note that when different discretization rules, such as Forward Euler, Backward Euler, Trapezoidal rules, etc., are used for the transient simulation of the capacitive branches and the inductive branches, different formulas for equivalent resistor values and voltage values may be generated.

Once the inductive branches and the capacitive branches, such as branches 321 and 328, are represented as equivalent resistive branches as illustrated in the FIG. 2, the sub-network 305 between the interface nodes 301 and 302 contains only resistive branches, connecting to either internal nodes of the sub-network or known voltages. Thus, the internal node voltages can be represented as the function of the node voltages of interface nodes 301 and 302 and the known voltages. Once the internal nodes are represented as in terms of the interface nodes 301 and 302 and the known voltages, the node voltage variables for the internal nodes can be eliminated; and the equation system for the entire RLC network can be reduced.

Figure 3:
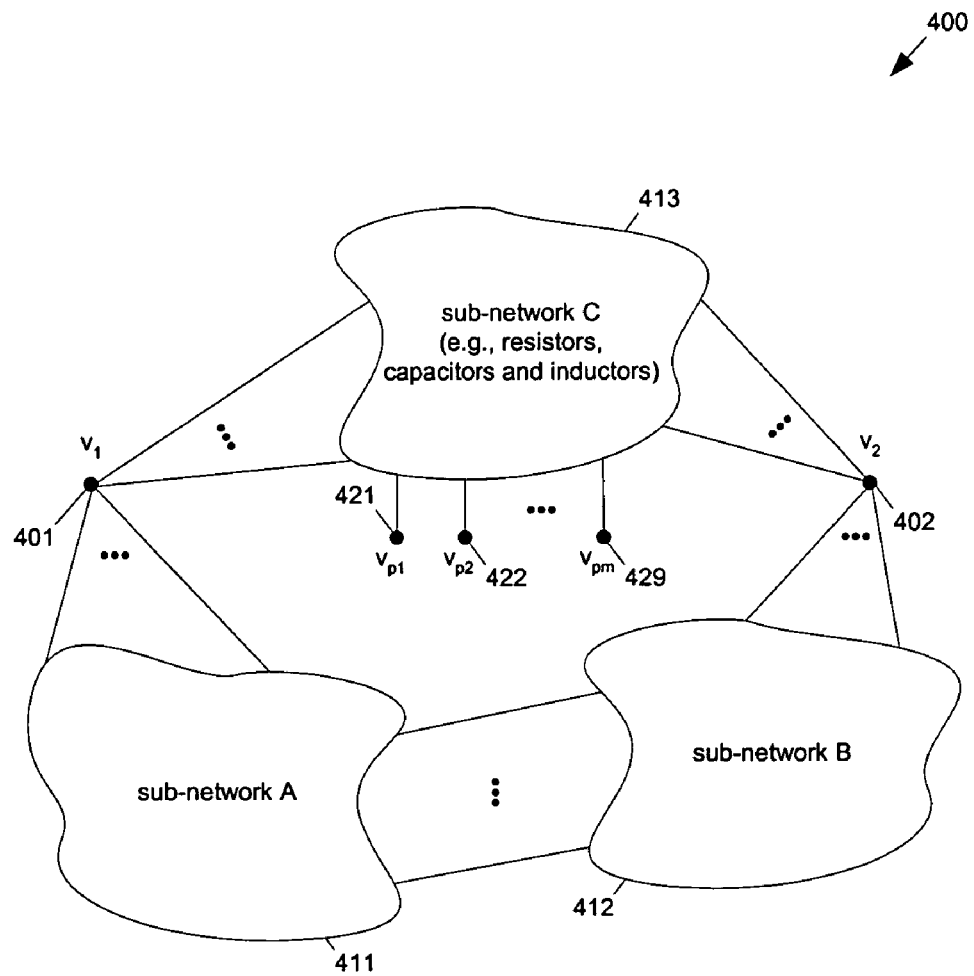
FIG. 3 illustrates a method to reduce a network of nodes according to one embodiment of the present invention.

FIG. 3 illustrates a method to reduce a network of nodes according to one embodiment of the present invention. In FIG. 3, the sub-network 413 interfaces with the remaining part of the circuit 400, such as sub-networks 411 and 413, through interface nodes 401 and 402. Interface nodes 401 and 402 has unknown voltages that is to be solved from a transient simulation. The sub-network 413 has a number of branches connecting to known voltages, such as $v_{p1}, v_{p2}, ... V_{pm}$ illustrated in FIG. 3. The remaining part of the circuit, such as sub-networks 411 and 413, may or may not further connect to each other and may or may not connect to the known voltages $v_{p1}, v_{p2}, ... V_{pm}$.

The sub-network 413 may in general include capacitors, resistors and/or inductors. The sub-network 413 includes a set of internal nodes. Consider that portion of the circuit 400 that includes the sub-network 413, interface nodes 401 and 402, and known voltage nodes 421, 422, ..., and 429. As described above, even when the portion of the circuit includes inductors, the simulation of this portion of the circuit can be represented as:

$$A_s V_s^{t+\Delta} = B_s$$

where $A_s$ is symmetric and positive definite; and $B_s$ contains only known quantities for the determination of the voltages at time instance t+Δ.

The nodes of this portion of circuit can be partitioned into interface nodes, internal nodes and known voltages nodes. Thus, the components of $V_s^{t+\Delta}$ can be grouped as $V_x^{t+\Delta}$ for the interface nodes, $V_e^{t+\Delta}$ for the internal nodes, and $V_k^{t+\Delta}$ for the known voltages nodes. Similarly, $A_s$ and $B_s$ can be partitioned for interface nodes, internal nodes and known voltages nodes.

Thus, $A_s V_s^{t+\Delta} = B_s$ can be used to solve for $V_e^{t+\Delta}$ in terms of $V_x^{t+\Delta}$ and $V_k^{t+\Delta}$. For example, if $A_s$ is written as $$\begin{bmatrix} A_{ee} & A_{ex} & A_{ek} \\ A_{ex}^T & A_{xx} & A_{xk} \\ A_{ek}^T & A_{xk}^T & A_{kk} \end{bmatrix}, V_s^{t+\Delta} \text{ as } \begin{Bmatrix} V_e^{t+\Delta} \\ V_x^{t+\Delta} \\ V_k^{t+\Delta} \end{Bmatrix},$$

and $B_s$ as $$\begin{Bmatrix} B_e \\ B_x \\ B_k \end{Bmatrix}, V_e^{t+\Delta}$$

can be solve for as $$V_e^{t+\Delta} = A_{ee}^{-1}[B_e - A_{ex} V_x^{t+\Delta} - A_{ek} V_k^{t+\Delta}]$$

Once the node voltages for the internal nodes are in terms of the node voltages of the interface nodes and known quantities, such as $V_k^{t+\Delta}$, the variables for the node voltages for the internal nodes can be eliminated in a way similar to that in the above described examples.

In this example, the known voltages are not necessary constants. Further, in general, the set of interface nodes may include more than two nodes. When the internal nodes are eliminated in terms of more than two interfaces nodes which have unknown voltages to be solved in the simulation step, the elimination process generally introduces cross-relation between the interface nodes, which may introduces non-zero coefficients for the resulting matrix. For example, if there is no branch on both nodes p and q, the matrix $A_n$ of the equation system is typically such that $A_{pq}=A_{qp}=0$. If internal nodes are eliminated in terms of voltages at nodes p and q, $A_{pq}=A_{qp}$ typically becomes non-zero. Further, when the number of internal nodes is large, evaluation $A_{ee}^{-1}$ can be time consuming. Thus, there is a tradeoff in selecting the sub-network for node reduction.

In one embodiment of the present invention, the sub-network is selected so that there are only two interface nodes. However, sub-networks with more than three interface nodes can also be selected for node reduction when the benefit of reduced dimension outweighs the additional non-zero coefficients. Further, when the sub-network has only one interface node, the node reduction can also be performed. Further, the sub-network may not have any branch connecting to known voltage nodes and may or may not have branches with known currents.

Thus, after creating a symmetric positive definite sparse matrix, one embodiment of the present invention applies a pre-conditioned conjugate gradient method to solve for the voltages and currents at each time instance. Such a method is faster than forming the equation system of a traditional method and using the direct method of solving the sparse matrix through Gaussian elimination or using an iterative method that can be applied to a sparse matrix which does not have the symmetric positive definite property.

The methods according to one embodiment of the present invention use less memory for large matrices, since there is no issue of fill-in of zero matrix entries into non-zero entries, which is encountered in Gaussian elimination.

Also the memory requirements are more predictable using the conjugate gradient method than Gaussian elimination where the number of fill-ins cannot be known precisely a priori.

Further, the methods according to one embodiment of the present invention can trade-off memory use for speed of execution, since the conjugate gradient solution method can be sped up by "pre-conditioning" the original matrix by another matrix which is an estimate of the original matrix's inverse. A good pre-conditioner reduces the solution time of the conjugate gradient method, although building the pre-conditioner can take up more memory. Therefore, transient simulation methods according to one embodiment of the present invention allow a way of trading off memory for runtime. On a computer with less memory, Gaussian elimination may simply not work for a large circuit. However, the conjugate gradient method may still be able to run even though it may be slower than if it had more memory.

FIGS. 4-7 shows flow charts of methods for transient simulation of a linear circuit according to some embodiments of the present invention.

Figure 4:
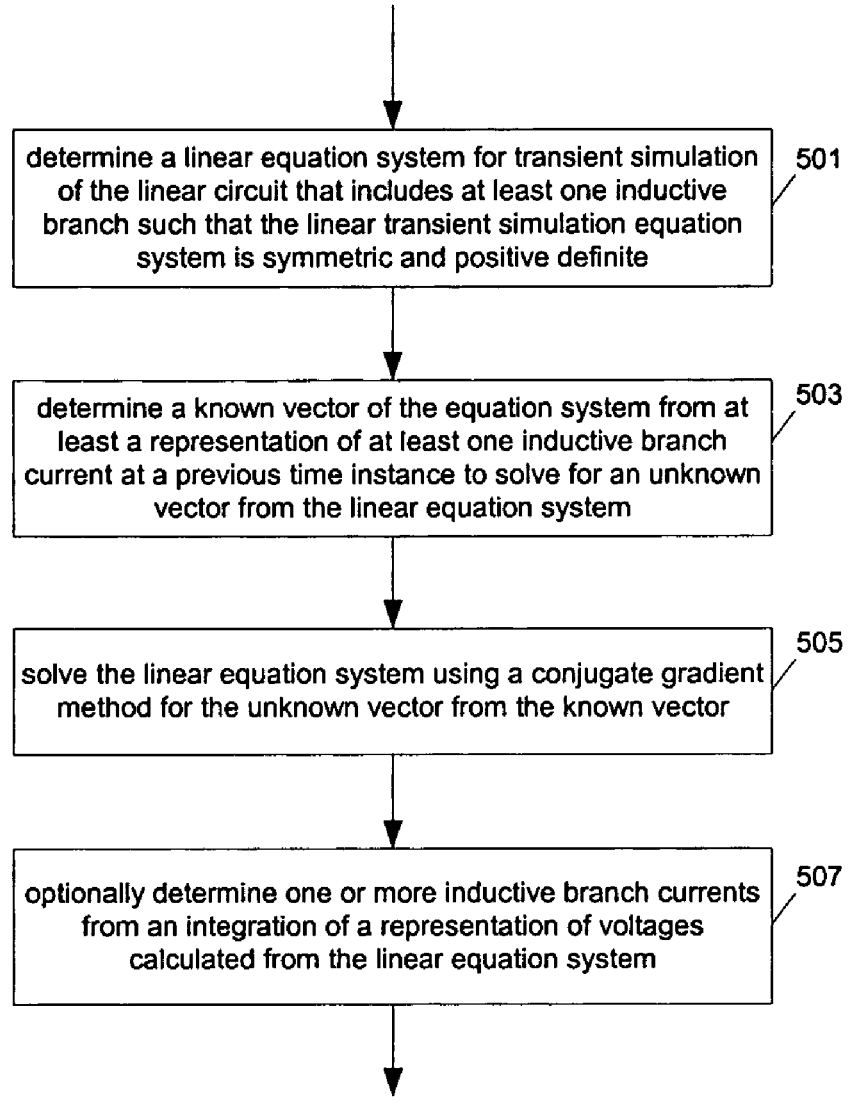
FIGS. 4-7 shows flow charts of methods for transient simulation of a linear circuit according to some embodiments of the present invention.

In FIG. 4, operation 501 determines a linear equation system for transient simulation of the linear circuit that includes at least one inductive branch such that the linear transient simulation equation system is symmetric and positive definite. Operation 503 determines a known vector of the equation system from at least a representation of at least one inductive branch current at a previous time instance to solve for an unknown vector from the linear equation system. An example of a representation of branch currents is an integration of branch voltages for inductive branches. Operation 505 solves the linear equation system using a conjugate gradient method for the unknown vector from the known vector. Alternatively, other methods designed for a symmetric and positive definite equation system can also be used. When the inductive branch currents are observed, operation 507 optionally determines one or more inductive branch currents from an integration of a representation of voltages calculated from the linear equation system.

Figure 5:
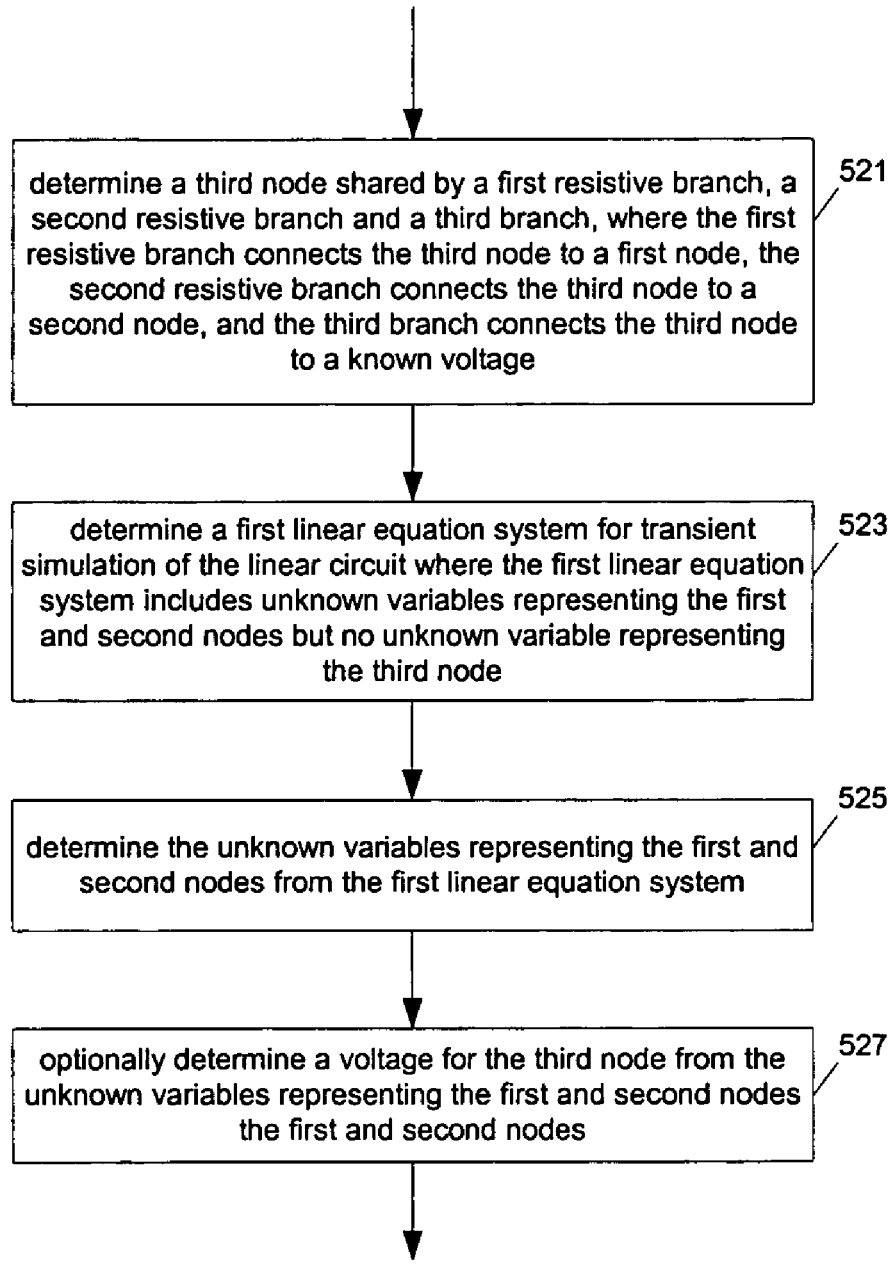

In FIG. 5, operation 521 determines a third node shared by a first resistive branch, a second resistive branch and a third branch, where the first resistive branch connects the third node to a first node, the second resistive branch connects the third node to a second node, and the third branch connects the third node to a known voltage. Operation 523 determines a first linear equation system for transient simulation of the linear circuit where the first linear equation system includes unknown variables representing the first and second nodes but no unknown variable representing the third node. In one embodiment of the present invention, the first linear equation system is symmetric and positive definite, even when the linear circuit contains one or more inductors. Thus, the linear equation system can be solved using a pre-conditioned conjugate gradient method. Operation 525 determines the unknown variables representing the first and second nodes from the first linear equation system. When the third node is observed, operation 527 optionally determines a voltage for the third node from the unknown variables representing the first and second nodes the first and second nodes.

Figure 6:
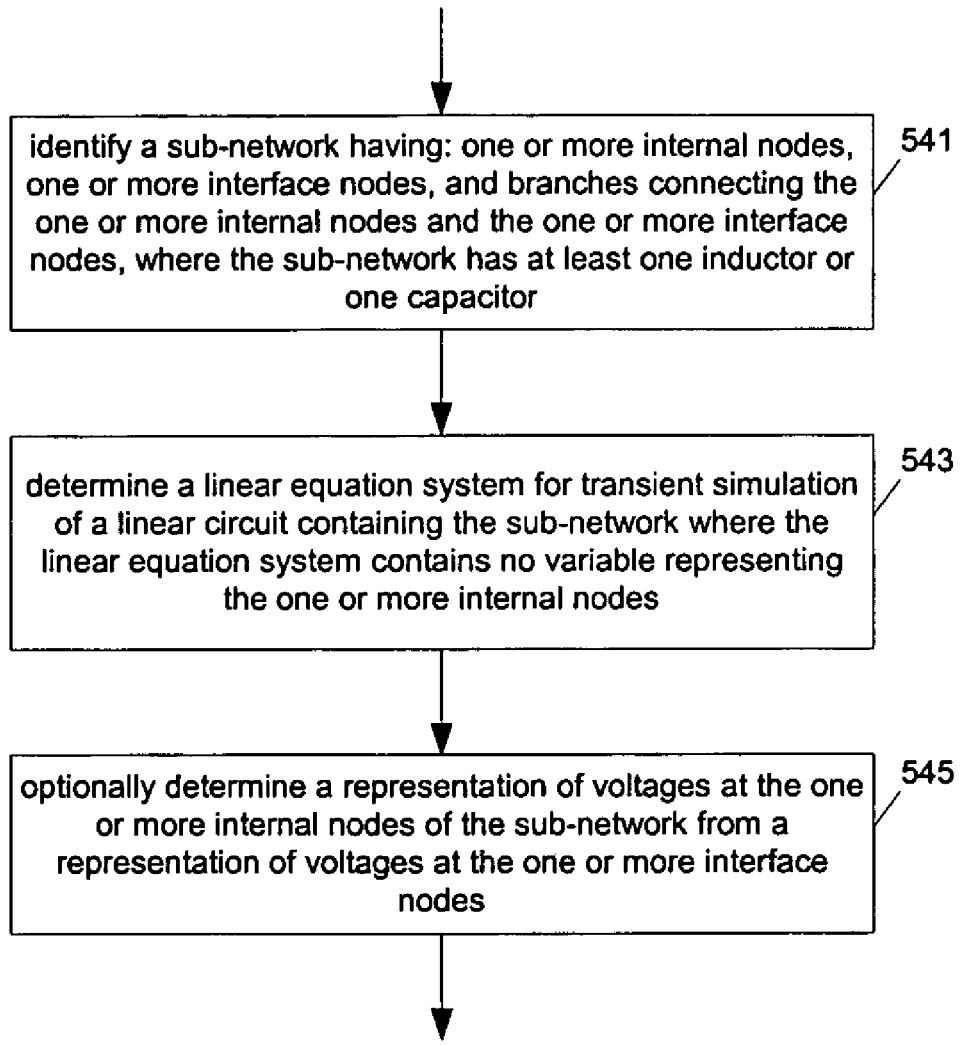

In FIG. 6, operation 541 identifies a sub-network having: one or more internal nodes, one or more interface nodes, and branches connecting the one or more internal nodes and the one or more interface nodes, where the sub-network has at least one inductor or one capacitor. The sub-network may or may not contain branches connected to known voltages. Operation 543 determines a linear equation system for transient simulation of a linear circuit containing the sub-network where the linear equation system contains no variable representing the one or more internal nodes. The one or more internal nodes are eliminated in terms of the one or more interface nodes. In one embodiment of the present invention, sub-network has no more than two interface nodes; and the internal nodes are eliminated in terms of the no more than two interface nodes. When the internal nodes are observed, operation 545 optionally determines a representation of voltages at the one or more internal nodes of the sub-network from a representation of voltages at the one or more interface nodes.

Figure 7:
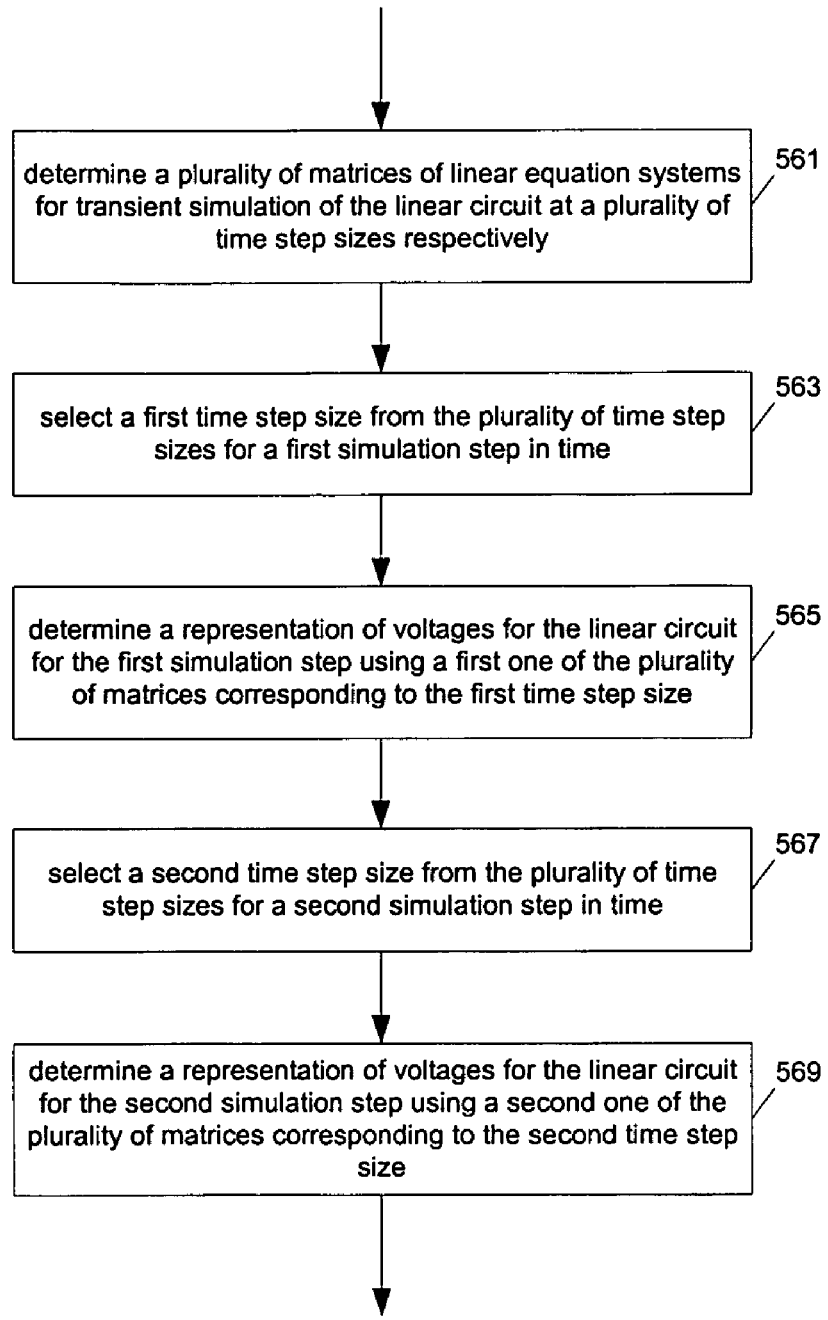

In FIG. 7, operation 561 determines a plurality of matrices of linear equation systems for transient simulation of the linear circuit at a plurality of time step sizes respectively. In one embodiment of the present invention, the plurality of matrices are symmetric and positive definite; the plurality of matrices are pre-conditioned for used with a conjugate gradient method for solving unknowns of transient simulation. Operation 563 selects a first time step size from the plurality of time step sizes for a first simulation step in time. Operation 565 determines a representation of voltages for the linear circuit for the first simulation step using a first one of the plurality of matrices corresponding to the first time step size. Operation 567 selects a second time step size from the plurality of time step sizes for a second simulation step in time. Operation 569 determines a representation of voltages for the linear circuit for the second simulation step using a second one of the plurality of matrices corresponding to the second time step size. In one embodiment, the selection of the first and second time step sizes is according to the changes in a representation of changes in load currents.

Many of the methods of the present invention may be performed with a digital processing system, such as a conventional, general-purpose computer system. Special purpose computers, which are designed or programmed to perform only one function, may also be used.

Figure 8:
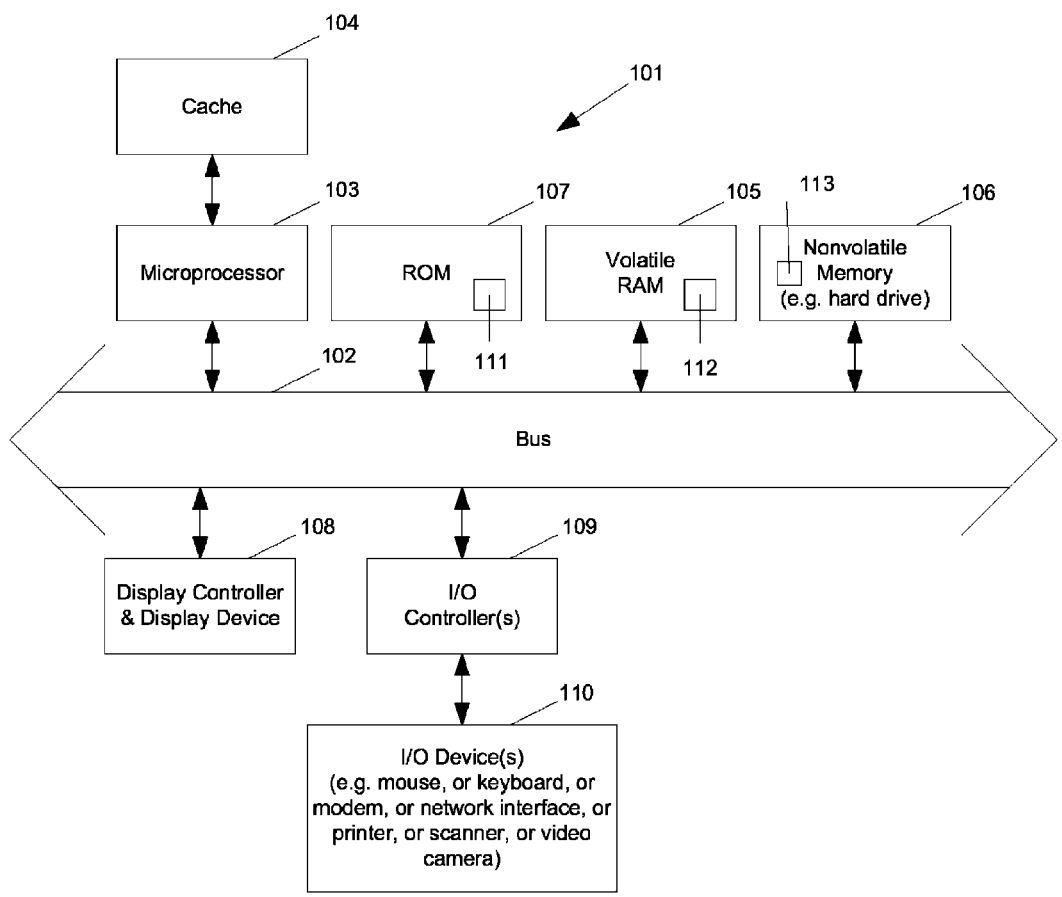
FIG. 8 shows a block diagram example of a data processing system which may be used with the present invention.

FIG. 8 shows one example of a typical computer system which may be used with the present invention. Note that while FIG. 8 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 8 may, for example, be a Sun workstation, or a personal computer (PC) running a Windows operating system, or an Apple Macintosh computer.

As shown in FIG. 8, the computer system 101, which is a form of a data processing system, includes a bus 102 which is coupled to a microprocessor 103 and a ROM 107 and volatile RAM 105 and a non-volatile memory 106. The microprocessor 103 is coupled to cache memory 104 as shown in the example of FIG. 8. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 8 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data 111, 112, 113 may be stored in various places including for example ROM 107, volatile RAM 105, non-volatile memory 106 and/or cache 104 as shown in FIG. 8. Portions of this software and/or data 111, 112, 113 may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A non-transitory machine readable storage medium containing executable computer program instructions stored thereon, which when executed by a digital processing system, cause said system to perform transient simulation of a linear circuit, comprising:
    identifying a third node in a first representation of the linear circuit, the third node shared by a first resistive branch, a second resistive branch, and a third branch, the first resistive branch connecting the third node to a first node, the second resistive branch connecting the third node to a second node, the third branch coupling the third node to a known voltage, wherein the third branch has an inductive element between the third node and the known voltage;
    determining a first linear equation system for transient simulation of the linear circuit having an unknown current variable of the third branch and an unknown voltage variable representing the third node replaced by an expression of unknown variables representing nodes other than the third node including the first node and the second node, the first linear transient simulation equation system being symmetric and positive definite, and the first linear transient simulation equation system being solved using a conjugate gradient method;
    eliminating the third node by replacing the unknown current variable of the third branch and the unknown voltage variable representing the third node with the unknown variables representing voltages on the first node and the second node to generate a second representation of the linear circuit;
    determining the unknown variables representing the first and second nodes from the first linear equation system to observe behavior of the linear circuit over time; and
    determining a voltage for the third node from the voltages for the first and second nodes.

2. The medium of claim 1, wherein the third branch is capacitive.

3. The medium of claim 2, wherein the known voltage is ground.

4. The medium of claim 1, wherein the third branch is inductive.

5. The medium of claim 1, wherein the circuit comprises at least one inductive branch.

6. The medium of claim 1, wherein the first and second nodes are on the first and second branches respectively.

7. The medium of claim 1, wherein the method further comprises:
    determining a second linear equation system for transient simulation of the linear circuit, the second linear equation system comprising unknown variables for the first, second and third nodes.

8. The medium of claim 1, wherein a path between the first and second nodes comprises a fourth node; the first linear transient simulation equation system comprises no unknown variable for the fourth node.

9. The medium of claim 8, wherein the fourth node is shared by two resistive branches on the path and a branch which connects to a known voltage.

10. A machine-implemented method of transient simulation of a linear circuit, the method comprising:
    identifying, using a processor, a third node of a first representation of the linear circuit, the third node shared by a first resistive branch, a second resistive branch and a third branch, the first resistive branch connecting the third node to a first node, the second resistive branch connecting the third node to a second node, the third branch coupling the third node to a known voltage, wherein the third branch has an inductive element between the third node and the known voltage;
    determining, using a processor, a first linear equation system for transient simulation of the linear circuit having an unknown current variable of the third branch and an unknown voltage variable representing the third node replaced by an expression of unknown variables representing nodes other than the third node including the first node and the second node, the first linear transient simulation equation system being symmetric and positive definite, and the first linear transient simulation equation system being solved using a conjugate gradient method;
    eliminating, using a processor, the third node by replacing the unknown current variable of the third branch and the unknown voltage variable representing the third node with the unknown variables representing voltages on the first node and the second node to generate a second representation of the linear circuit;
    determining, using a processor, the unknown variables representing the first and second nodes from the first linear equation system to store in a memory; and
    determining a voltage for the third node from the voltages for the first and second nodes.

11. The machine-implemented method of claim 10, wherein the third branch is capacitive.

12. The machine-implemented method of claim 11, wherein the known voltage is ground.

13. The machine-implemented method of claim 10, wherein the third branch is inductive.

14. The machine-implemented method of claim 10, wherein the circuit comprises at least one inductive branch.

15. The machine-implemented method of claim 10, wherein the first and second nodes are on the first and second branches respectively.

16. The machine-implemented method of claim 10, further comprising:
    determining a second linear equation system for transient simulation of the linear circuit, the second linear equation system comprising unknown variables for the first, second and third nodes.

17. The machine-implemented method of claim 10, wherein a path between the first and second nodes comprises a fourth node; the first linear transient simulation equation system comprises no unknown variable for the fourth node.

18. The machine-implemented method of claim 17, wherein the fourth node is shared by two resistive branches on the path and a branch which connects to a known voltage.

19. A data processing system for transient simulation of a linear circuit, the data processing system comprising:
    a memory; and
    means for identifying a third node of a first representation of the linear circuit, the third node that is shared by a first resistive branch, a second resistive branch and a third branch, the first resistive branch connecting the third node to a first node, the second resistive branch connecting the third node to a second node, the third branch coupling the third node to a known voltage, wherein the third branch has an inductive element, or a capacitive element between the third node and the known voltage, and wherein the means for the identifying is coupled to the memory;

means for determining a first linear equation system for transient simulation of the linear circuit having an unknown current variable of the third branch and an unknown voltage variable representing the third node replaced by an expression of unknown variables representing nodes other than the third node including the first node and the second node, the first linear transient simulation equation system being symmetric and positive definitive, and the first linear transient simulation equation system being solved using a conjugate gradient method, wherein the means for the determining the first linear equation system is coupled to the memory;

eliminating the third node by replacing the unknown current variable of the third branch and the unknown voltage variable representing the third node with the unknown variables representing voltages on the first node and the second node to generate a second representation of the linear circuit;

means for determining the unknown variables representing the first and second nodes from the first linear equation system, wherein the means for determining the unknown variables is coupled to the memory to observe behavior of the linear circuit over time; and means for determining a voltage for the third node from the voltages for the first and second nodes.

20. The data processing system of claim 19, wherein the third branch is capacitive.

21. The data processing system of claim 20, wherein the known voltage is ground.

22. The data processing system of claim 19, wherein the third branch is inductive.

23. The data processing system of claim 19, wherein the circuit comprises at least one inductive branch.

24. The data processing system of claim 19, wherein the first and second nodes are on the first and second branches respectively.

25. The data processing system of claim 19, further comprising:

means for determining a second linear equation system for transient simulation of the linear circuit, the second linear equation system comprising unknown variables for the first, second and third nodes, wherein the means for determining the second linear equation system is coupled to the memory.

26. The data processing system of claim 19, wherein a path between the first and second nodes comprises a fourth node; the first linear transient simulation equation system comprises no unknown variable for the fourth node.

27. The data processing system of claim 26, wherein the fourth node is shared by two resistive branches on the path and a branch which connects to a known voltage.

\* \* \* \* \*